(12) United States Patent
Miyashita

(10) Patent No.: US 9,232,573 B2
(45) Date of Patent: Jan. 5, 2016

(54) LIGHTING DEVICE AND METHOD OF MANUFACTURING THE SAME

(71) Applicants: CITIZEN ELECTRONICS CO., LTD., Yamanashi-ken (JP); CITIZEN HOLDINGS CO., LTD., Tokyo (JP)

(72) Inventor: Junji Miyashita, Yamanashi-ken (JP)

(73) Assignees: CITIZEN ELECTRONICS CO., LTD., Yamanashi-ken (JP); CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/522,932

(22) Filed: Oct. 24, 2014

(65) Prior Publication Data

US 2015/0115793 A1    Apr. 30, 2015

(30) Foreign Application Priority Data

Oct. 25, 2013    (JP) .................. 2013-222445

(51) Int. Cl.
| | |
|---|---|
| H01L 51/52 | (2006.01) |
| H01L 51/50 | (2006.01) |
| H01L 51/54 | (2006.01) |
| H05B 33/04 | (2006.01) |
| H01L 33/60 | (2010.01) |
| H01L 33/44 | (2010.01) |

(52) U.S. Cl.
CPC ............... *H05B 33/04* (2013.01); *H01L 33/60* (2013.01); *H01L 33/44* (2013.01)

(58) Field of Classification Search
CPC ............ H01L 51/5237; H01L 51/5246; H01L 51/524; H01L 51/525; H01L 2251/5315; H01L 2251/5307; H01L 27/3244; H01L 27/3246; H01L 27/3283; H01L 27/3295; H01L 25/075; H05B 33/04
USPC ............. 313/498–512; 362/555, 545, 249.02, 362/311.02, 800
See application file for complete search history.

(56) References Cited

U.S. PATENT DOCUMENTS

| | | | | |
|---|---|---|---|---|
| 5,226,723 | A  * | 7/1993 | Chen .............................. | 362/241 |
| 6,345,903 | B1 | 2/2002 | Koike et al. | |
| 6,443,597 | B1 * | 9/2002 | Natori ........................... | 362/304 |
| 6,603,258 | B1 | 8/2003 | Mueller-Mach et al. | |
| 6,921,183 | B2 * | 7/2005 | Yang et al. .................... | 362/241 |
| 7,175,304 | B2 * | 2/2007 | Wadia et al. .................. | 362/241 |
| 7,204,604 | B2 * | 4/2007 | Chou ............................. | 362/227 |
| 8,113,688 | B2 * | 2/2012 | Marchl et al. ............ | 362/249.02 |
| 2006/0023451 | A1 * | 2/2006 | Han et al. ...................... | 362/249 |
| 2006/0138441 | A1 * | 6/2006 | Kromotis et al. ............... | 257/99 |
| 2006/0197098 | A1 | 9/2006 | Aihara | |

(Continued)

FOREIGN PATENT DOCUMENTS

| | | |
|---|---|---|
| JP | 2004-207369 | 7/2004 |
| JP | 2012-227230 | 11/2012 |

*Primary Examiner* — Anne Hines
*Assistant Examiner* — Jose M Diaz
(74) *Attorney, Agent, or Firm* — Wenderoth, Lind & Ponack, L.L.P.

(57) ABSTRACT

In a first aspect of the present inventive subject matter, a lighting device includes a substrate, a light-emitting element electrically mounted on the substrate, a frame member including a white-colored resin and surrounding the light-emitting element, and a light-transmitting resin in which the light-emitting element and the frame member are embedded. Also, it is suggested that the frame member further includes a light-shielding member entirely sealed by the white-colored resin.

20 Claims, 17 Drawing Sheets

(56) References Cited

U.S. PATENT DOCUMENTS

| | | | |
|---|---|---|---|
| 2006/0215075 A1* | 9/2006 | Huang et al. | 349/67 |
| 2009/0244885 A1* | 10/2009 | Watanabe et al. | 362/97.1 |
| 2010/0025700 A1* | 2/2010 | Jung et al. | 257/89 |
| 2012/0112236 A1* | 5/2012 | Higuma et al. | 257/98 |
| 2014/0028173 A1* | 1/2014 | Tsuchiya et al. | 313/46 |
| 2014/0042481 A1* | 2/2014 | Inoue et al. | 257/98 |

\* cited by examiner

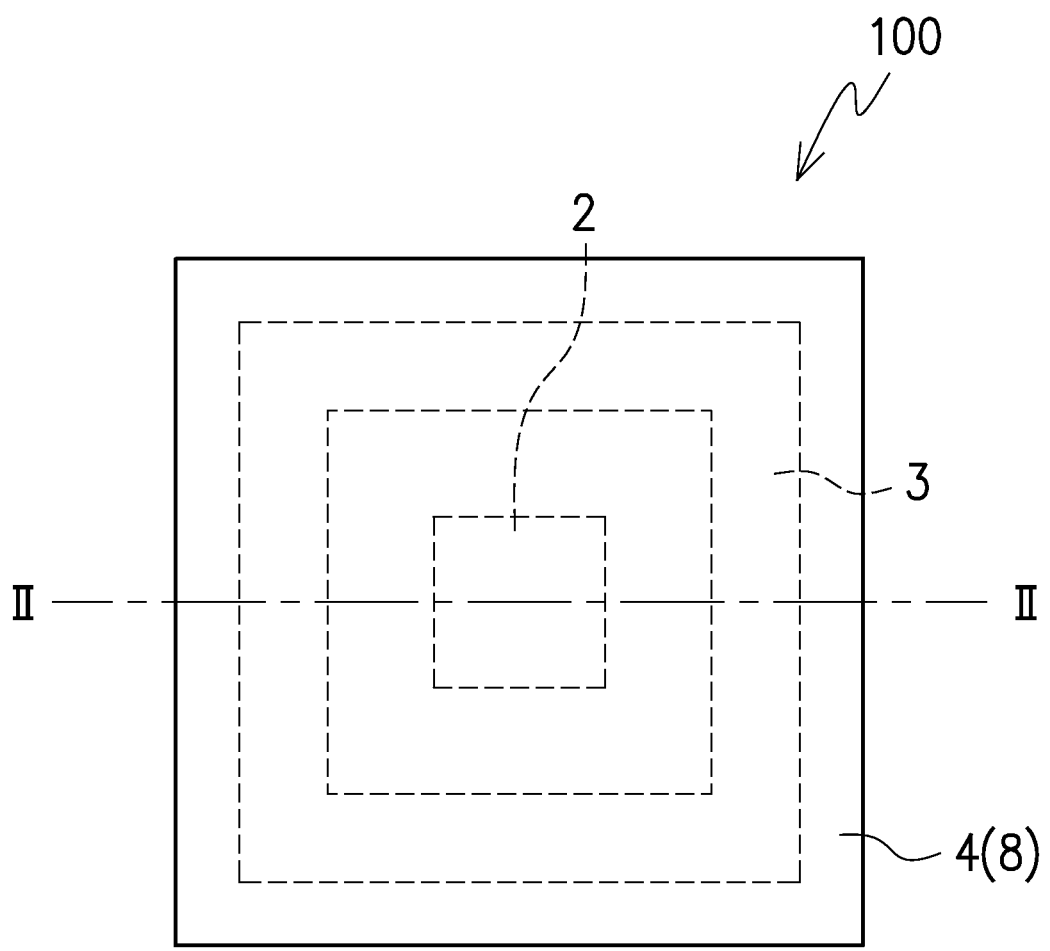

LIGHTING DEVICE AND METHOD OF MANUFACTURING THE SAME

CROSS-REFERENCE TO RELATED APPLICATION

This application is a new U.S. patent application that claims benefit of JP2013-222445, filed on Oct. 25, 2013, the disclosures of which are incorporated herein by reference in its entirety.

BACKGROUND OF THE INVENTION

1. Field of the Invention

The present invention relates to a lighting device including a frame member arranged around a light-emitting element, and also relates to a method of manufacturing a lighting device including a frame member.

2. Description of the Related Art

A lighting device including a frame, reflector cup, or partition is suggested in some patent applications as follows.

For example, it is open to the public that a light-emitting diode includes a light-emitting diode element mounted on an upper surface of a glass epoxy substrate, a reflection frame placed around the light-emitting diode element, a second resin encapsulator and a third resin encapsulator used as a surface layer are stacked on an upper portion of the glass epoxy substrate including the reflection frame in layer form to seal the entirety of the first resin encapsulator (For reference, see U.S. Pat. No. 6,345,903).

Also, it is open to the public that a light emitting diode device that emits white light includes a reflector cup, an LED that is mounted in the reflector cup, and a phosphor-converting resin filled in the reflector cup. Also, it is suggested that the LED may be mounted in either a normal or flip-chip configuration within the reflector cup (For reference, see U.S. Pat. No. 6,603,258).

Furthermore, it is open to the public that a surface mounting type white LED includes a chip substrate with at least a pair of surface mounting terminals, a blue LED chip mounted on the chip substrate and electrically connected to the pair of surface mounting terminals, a frame-type member made of solder resist for example and formed on the chip substrate around a periphery of the blue LED, and a bonding agent that includes a phosphor to adhere the blue LED to the chip substrate, and a lens formed of the transparent resin to seal the blue LED chip, the frame-type member, and the bonding agent layer on the chip substrate (For reference, see Japanese Unexamined Patent Application Publication No. 2004-207369).

In addition, it is open to the public that a light emitting device includes a substrate, a blue LED element mounted on the substrate, a resinous sealing body including yellow fluorescent particles and sealing the blue LED element, a green LED element mounted on the substrate, a resinous sealing body including red fluorescent particles and sealing the green LED element (For reference, see U.S. Unexamined Patent Application Publication No. US 2006/0197098 A1). Also, it is suggested that a partition is arranged between the blue LED element and the green LED element in FIG. 4 of US 2006/0197098 A1.

Also, it is open to the public that a semiconductor light emitting device includes a circuit board, multiple LEDs mounted on the circuit board by flip chip mounting and serially connected, and electrodes for heat radiation on a rear surface side of the circuit board, and a sealing resin that may be a transparent resin or phosphor resin sealing the multiple LEDs mounted on the substrate (For reference, see Japanese Unexamined Patent Application Publication No. 2012-227230).

SUMMARY OF THE INVENTION

In a first aspect of the present inventive subject matter, a lighting device includes a substrate, a light-emitting element electrically mounted on the substrate, a frame member including a white-colored resin and surrounding the light-emitting element, and a light-transmitting resin in which the light-emitting element and the frame member are embedded.

It is suggested that the light-transmitting resin includes a phosphor.

Also, it is suggested that the light-transmitting resin includes transparent resin.

Furthermore, it is suggested that the light-transmitting resin includes a first light-transmitting resin and a second light-transmitting resin, and the first light-transmitting resin includes a phosphor and is arranged as a phosphor layer covering an upper surface and a peripheral side surface of the light-emitting element, and the second light-transmitting resin entirely seals the light-emitting element, the frame member, and the first light-transmitting resin arranged as the phosphor layer covering the upper surface and the peripheral side surface of the light-emitting element.

Also, it is suggested that the frame member includes a sloping surface that faces a peripheral side surface of the light-emitting element.

Furthermore, it is suggested that the frame member further includes a light-shielding member, and the white-colored resin of the frame member including a reflective particle seals the light-shielding member.

Also, it is suggested that the light-shielding member of the frame member include a black-colored resin.

In addition, it is suggested that the light-shielding member of the frame member includes a graphite powder.

In a second aspect of the present inventive subject matter, a lighting device includes a substrate, two or more light-emitting elements electrically mounted on the substrate, a frame member including a white-colored resin and two or more openings each in which at least one light-emitting element of the two or more light-emitting elements is arranged, and a light-transmitting resin in which the light-emitting element and the frame member are embedded.

It is suggested that the frame member further includes a light-shielding member that is embedded in the white-colored resin of the frame member.

Also, it is disclosed that the two or more openings of the frame member may be aligned in a line.

Furthermore, it is disclosed that the two or more openings of the frame member may be arranged in a shape of grid.

Also, it is suggested that the frame member further includes a sloping surface.

In a third aspect of the present inventive subject matter, a method of manufacturing a lighting device includes electrically mounting a light-emitting element on an upper surface of a substrate, arranging a frame member, which comprises a light-shielding member embedded in a white-colored resin, on the upper surface of the substrate such that the light-emitting element is positioned in an opening of the frame member, and entirely sealing the light-emitting element and the frame member on the upper surface of the substrate with a light-transmitting resin.

BRIEF DESCRIPTION OF THE DRAWINGS

FIG. 1 is a schematic top plan view of lighting device according to a first embodiment of the present invention.

DETAILED DESCRIPTION OF THE EMBODIMENTS

Figure 2A:
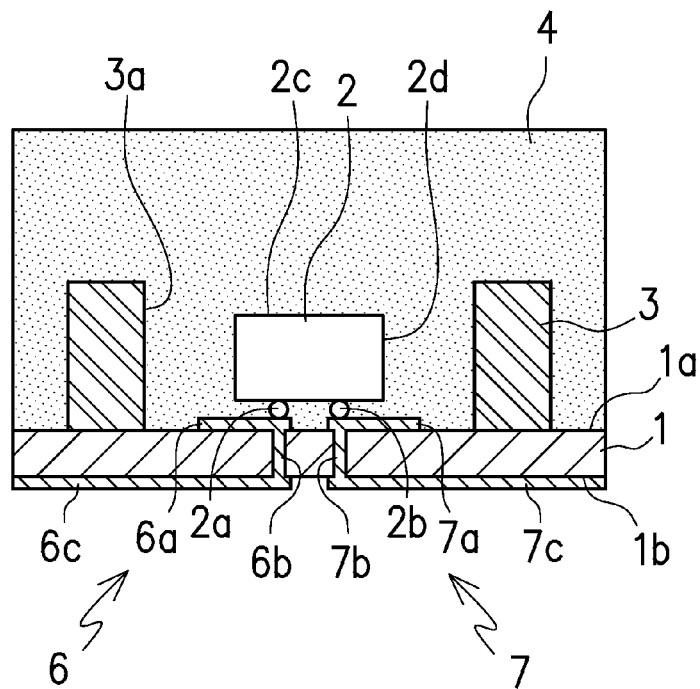
FIG. 2A is a cross-sectional view of lighting device taken along a line II-II shown in FIG. 1, showing a first variation of frame member.

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "contains", "containing", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "uppermost" or "lower" or "upward" or "downward" or "left" or "right" or "front" or "rear" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar and/or corresponding and/or related structures throughout. It should be noted that the drawings are schematic in nature.

FIG. 1 is a schematic top plan view of lighting device according to a first embodiment of the present invention.

A lighting device 100 includes a substrate 1, a light-emitting element 2 electrically mounted on the substrate 1, a frame member 3 surrounding the light-emitting element 2, and a light-transmitting resin 4 in which the light-emitting element 2 and the frame member 3 are embedded.

The light-emitting element 2 and the frame member 3 arranged on an upper surface 1a of the substrate 1 are entirely embedded within the light-transmitting resin. Accordingly, it is possible to make directivity of light through a region in an opening surrounded by the frame member 3, efficiently making use of lateral light emitted from the light-emitting element 2 as upward light.

FIG. 2A is a cross-sectional view of lighting device taken along a line II-II shown in FIG. 1, showing a first variation of frame member 3. The frame member 3 includes an inner surface 3a that surrounds a peripheral side surface 2d of the light-emitting element 2. The inner surface 3a of the frame member 3 defines an opening in which the light-emitting element 2 is arranged. The inner surface 3a of the frame member 3 in this embodiment is a square ring, rectangular ring, or a perpendicular ring surface perpendicular to an upper surface 1a of the substrate 1.

The frame member 3 is configured to shield and/or reflect light. The frame member 3 may include a silicone resin as a primary material, and the light-transmitting resin 4 may include a silicone resin as a primary material. The words "primary material" means a material with highest percentage of amount of all which are contained in a member or an element.

In this embodiment the frame member 3 may be made of white-colored resin. For example, the frame member 3 may be made of silicone resin including titanium oxide ($TiO_2$) particle as a reflective particle. The frame member 3 may be opaque. As a reflective particle, titanium oxide particle, silicon dioxide particle, zirconium dioxide, aluminum oxide particle, and/or boron nitride particle is available.

Because the frame member 3 surrounding the light-emitting element 2 is entirely embedded in the light-transmitting resin 4, it is possible to obtain a lighting device with a shape, which is unaffected by the shape of the frame member 3 surrounding the light-emitting element 2.

Also, the light-transmitting resin may be made of silicone resin and/or may include silicone resin. If the light-transmitting resin and the frame member are made of a same material and/or include a same material, adhesive properties of the light-transmitting resin and the frame member 3 are enhanced.

Accordingly, it is possible to obtain a lighting device with a cubic shape or a parallelepiped shape as a whole, even when the frame member 3 has a shape selected among a square ring shape, a rectangular ring shape, and a circular ring shape in a top plan view, for example. It is possible to obtain light emitted from a square region surrounded by the frame member 3 that has a square ring shape. The words "square ring shape" here include a shape of square ring shape with rounded corners.

Also, it is possible to obtain light emitted from a rectangular region surrounded by the frame member 3 that has a rectangular ring shape. The words "rectangular ring shape" here include a shape of rectangular ring shape with rounded corners.

Furthermore, it is possible to obtain light emitted from a circular region surrounded by the circular ring shape.

The white-colored resin of the frame member 3 constitutes an outer shape of the frame member 3 with an opening in which the light-emitting element 2 is electrically mounted on electrodes arranged on an upper surface $1a$ of the substrate 1.

For more details, the substrate 1 includes a first electrode 6 and a second electrode 7. The first electrode 6 includes a first upper electrode $6a$ arranged on the upper surface $1a$ of the substrate 1, a first lower electrode $6c$ arranged on a lower surface $1b$ of the substrate 1, and a first through-hole $6b$ extending in the substrate 1 and electrically connected to the first upper electrode $6a$ and the first lower electrode $6c$. Also, the second electrode 7 includes an upper electrode $7a$ arranged spaced away from the upper electrode $6a$ of the first electrode 6, a lower electrode $7c$ arranged spaced away from the lower electrode $6c$ of the first electrode, and a second through-hole $7b$ spaced away from the first through-hole $6b$ and extending in the substrate 1 and electrically connected to the second upper electrode $7a$ and the second lower electrode $7c$.

A light-emitting element 2 included in a lighting device 100 may be configured to emit light with peak emission spectrum in a range of 350 nm to 500 nm. Light with peak emission spectrum range 490 nm-560 nm may appear to be green light, light with peak emission spectrum range 400 nm-490 nm may appear to be blue light, and light with emission spectrum peak range 350 nm-400 nm may appear to be near ultraviolet light. Light with peak emission spectrum range 10 nm-350 nm may be categorized as ultraviolet light.

The phosphor included in the light-transmitting resin 4 is selectable from phosphors that are excitable in response to light from a light source.

The light-emitting element 2 may be ultraviolet light-emitting diode element. For example, if the light-emitting element 2 is a light-emitting element with emission spectrum peak range from 380 nm to 400 nm, a phosphor or a combination of two or more phosphors including red phosphor, yellow phosphor, green phosphor and blue phosphor are selectable.

Also, the light-emitting element 2 may be blue light-emitting diode element. Also, a light-emitting element with peak emission spectrum in the range of 440 nm-460 nm is used as the light-emitting element 2, a phosphor included in the light-transmitting resin 4 is selectable among various phosphors that are excitable by light from the light-emitting element with peak emission spectrum in the range of 440 nm-460 nm.

For example, various phosphors include red phosphor, yellow phosphor, and green phosphor may be used with the light-emitting element.

As a red phosphor, $(Ca,Sr)AlSiN_3$:Eu, $CA_2Si_5N_8$:Eu, $AlSiN_3$:Eu, $CaSi_5N_8$:Eu, $K_2SiF_6$:Mn and/or $K_2TiF_6$:Mn is selectable, just as an example.

Also, as a yellow phosphor, $Y_3Al_5O_{12}$:Ce (Usually called as "YAG"), $(Sr,Ba)_2SiO_4$:Eu, $Ca_x(Si,Al)_{12}(O,N)_{16}$:Eu is selectable, just as an example.

As a green phosphor, $(Lu,Y)_3Al_5O_{12}$:Ce, $Y_3(Ga,Al)_5O_{12}$:Ce, $Ca_3Sc_2Si_3O_{12}$:Ce, $CaSc_2O_4$:Eu, $(Ba,Sr)_2SiO_2$:Eu, $Ba_3Si_6O_{12}N_2$:EU, $(Si,Al)_6(O,N)_8$:Eu, is selectable, just as an example.

As a blue phosphor, $BaMgAl_{10}O_{17}$:Eu, just as an example.

Figure 2B:
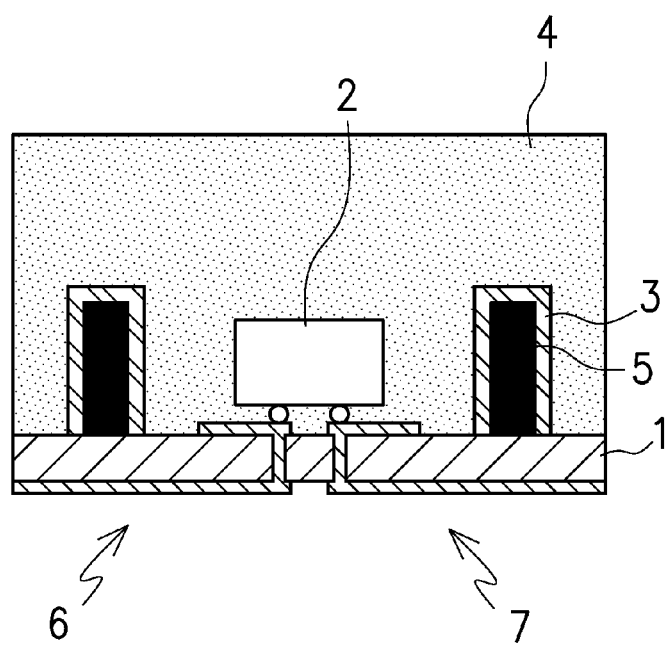
FIG. 2B is a cross sectional view of lighting device taken along a line II-II shown in FIG. 1, showing a second variation of frame member.

FIG. 2B is a cross sectional view of lighting device 100 taken along a line II-II shown in FIG. 1, showing a second variation of frame member 3. In this variation, the frame member 3 has a cross-sectional shape that is rectangular as shown in FIG. 2B. Different from the first variation of the frame member 3, the frame member 3 includes a light-shielding member 5. The white-colored resin of the frame member 3 includes a reflective particle, and the light-shielding member 5 of the frame member 3 is embedded in the white-colored resin. The light-shielding member 5 of the frame member 3 may be made of a black-colored resin. The light-shielding member 5 of the frame member 3 may include a metal powder. The light-shielding member 5 of the frame member 3 may include a graphite powder. Also, the light-shielding member 5 of the frame member 3 includes a sloping surface $5a$ inside the white-colored resin of the frame member 3. Furthermore, the light-shielding member 5 of the frame member 3 may include a metal frame embedded in the white-colored resin of the frame member 3.

The white-colored resin constitutes an outer shape of frame member 3 with an opening in which the light-emitting element 2 is electrically mounted on a first electrode 6 and a second electrode 7 of the substrate 1. The black-colored resin of the light-shielding member 5 is positioned inside the white-colored resin and has a shape surrounding the light-emitting element 2.

Accordingly, the light-shielding member 5 also has a similar outer shape of frame member 3, and the outer shape of the light-shielding member 5 is smaller than the outer shape of the white-colored resin in a plan view.

Because the light-shielding member 5 of the black-colored resin is entirely inside the white-colored resin of the frame member 3, the light-shielding member 5 is not shown in FIG. 1. The light-shielding member 5 of the frame member 3 may contain a graphite powder. Also, the light-shielding member 5 may contain a metal powder, which has a better light-absorption property than a reflective particle. If the frame member 3 includes the black-colored resin inside the white-colored resin, light hit the frame member 3 is efficiently reflected by the white-colored resin portion and sufficiently shielded by the black-colored resin portion to prevent lateral light of the light-emitting element 2 from passing through the frame member 3.

Figure 2C:
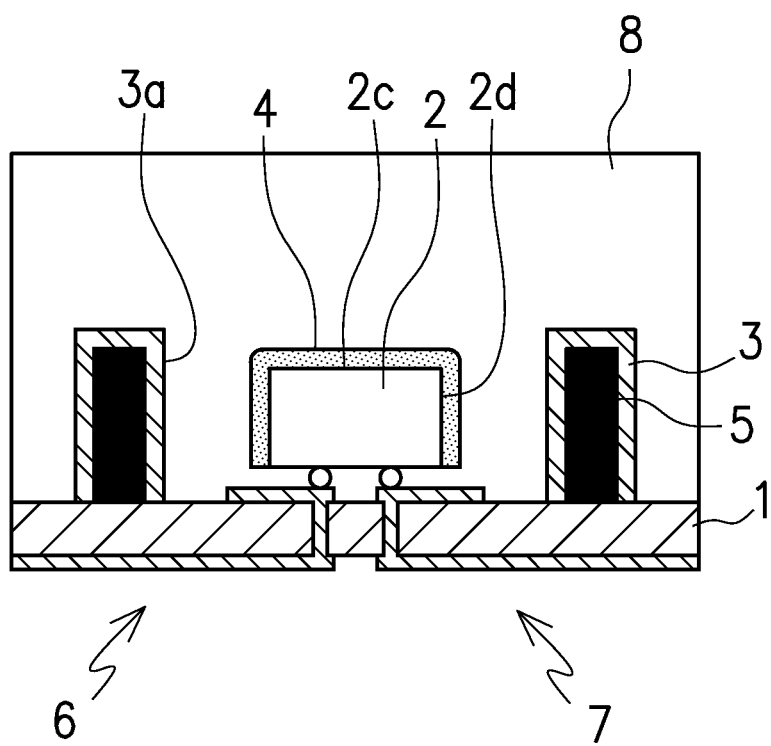
FIG. 2C is a cross sectional view of lighting device taken along a line II-II shown in FIG. 1, showing a light-transmitting resin that includes a first light-transmitting resin including a phosphor and a second light-transmitting resin that is transparent.

FIG. 2C is a cross sectional view of lighting device 100 taken along a line II-II shown in FIG. 1, showing a light-transmitting resin that includes a first light-transmitting resin 4 including a phosphor and a second light-transmitting resin 8 that is transparent. In this embodiment, since the second light-transmitting resin 8 entirely sealing the light-emitting element 2 with a layer of the first light-transmitting resin 4 and a frame member 3 is transparent, the light-emitting element 2 with the layer and the frame member 3 should appear to be more clear in the second light-transmitting resin 8 than a lighting device shown in FIG. 2A or FIG. 2B, in which the light-transmitting resin 4 including a phosphor 4 entirely seals the light-emitting element 2 and the frame member 3.

For more details about this embodiment, a lighting device includes a substrate 1, a light-emitting element 2 electrically mounted on the substrate 1, a frame member 3 surrounding the light-emitting element 2, and a light-transmitting resin 8 in which the light-emitting element 2 and the frame member 3 are embedded.

The light-emitting element 2 and the frame member 3 arranged on an upper surface 1a of the substrate 1 are entirely embedded within the light-transmitting resin.

Furthermore, the light-transmitting resin in this embodiment includes a first light-transmitting resin 4 and a second light-transmitting resin 8. The first light-transmitting resin 4 includes a phosphor and is arranged as a phosphor layer covering an upper surface 2c and a peripheral side surface 2d of the light-emitting element 2. The second light-transmitting resin 8 entirely seals the light-emitting element 2, the frame member 3, and the first light-transmitting resin 4 arranged as the phosphor layer covering the upper surface 2c and the peripheral side surface 2d of the light-emitting element 2.

Figure 3:
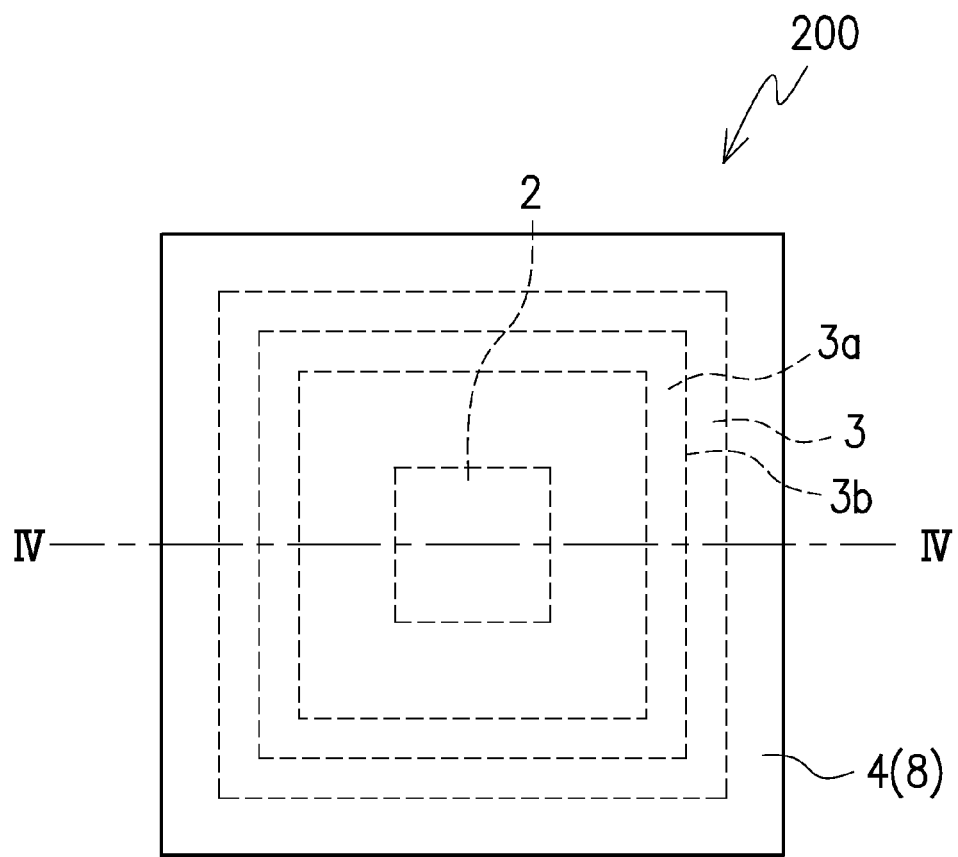
FIG. 3 is a schematic top plan view of lighting device according to a second embodiment of the present invention.

FIG. 3 is a schematic top plan view of lighting device according to a second embodiment of the present invention. The lighting device 200 of this embodiment includes a frame member 3 with a sloping surface 3a that faces the light-emitting element 2. Accordingly, it is possible to make directivity of light from the light-emitting element 2 as upward light efficiently with the sloping surface 3a.

Figure 4A:
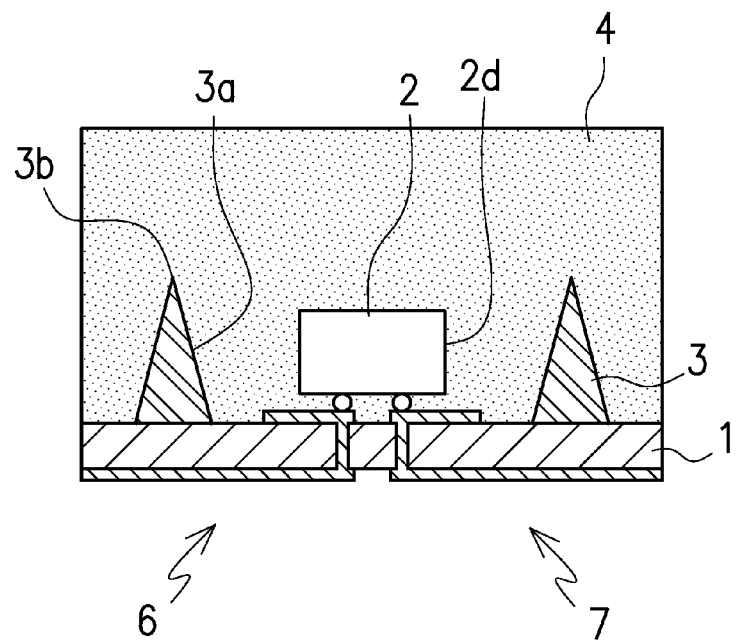
FIG. 4A is a cross sectional view of lighting device taken along a line IV-IV shown in FIG. 3, showing a third variation of frame member. In this variation, the frame member includes a sloping surface that faces a peripheral side surface of the light-emitting element. The sloping surface defines an opening in which a light-emitting element is arranged on a substrate.

FIG. 4A is a cross sectional view of lighting device 200 taken along a line IV-IV shown in FIG. 3, showing a third variation of frame member 3. In this third variation of frame member 3, the frame member 3 includes a sloping surface 3a that faces a peripheral side surface 2d of the light-emitting element 2. The sloping surface 3a of the frame member 3 defines an opening in which a light-emitting element 2 is arranged.

The sloping surface 3a of the frame member 3 is inclined upward. The frame member 3 may have a cross-sectional shape that is triangle with a ridge 3b, right-angled triangle, or isosceles triangle as shown in FIG. 4A, for example. The frame member 3 has a square ring shape with the ridge 3b that is an uppermost portion of the frame member 3 in a top plan view.

Figure 4B:
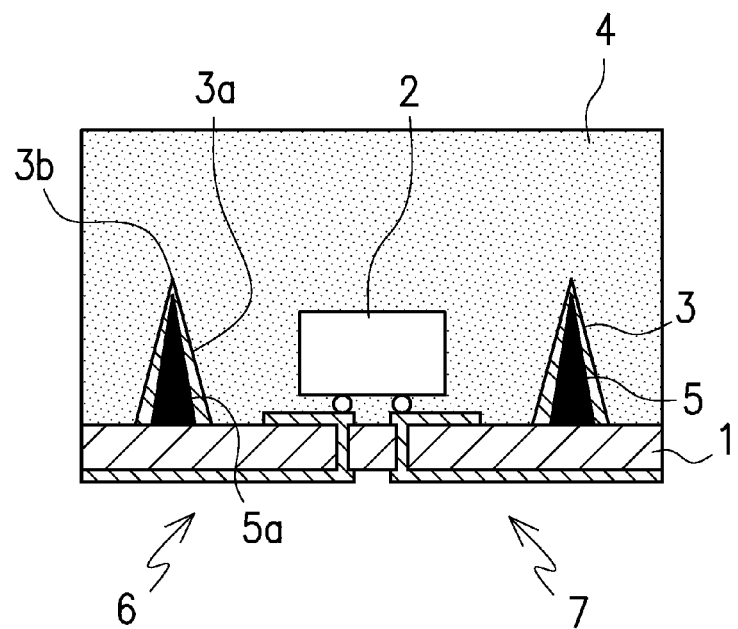
FIG. 4B is a cross sectional view of lighting device taken along a line IV-IV shown in FIG. 3, showing a fourth variation of frame member.

FIG. 4B is a cross sectional view of lighting device taken along a line IV-IV shown in FIG. 3, showing a fourth variation of frame member 3. In this embodiment, the frame member 3 further includes a light-shielding member 5. The white-colored resin of the frame member 3 includes a reflective particle, and the light-shielding member 5 of the frame member 3 may be embedded in the white-colored resin. As shown in FIG. 4B, the white colored resin of the frame member 3 includes a reflective particle and seals the light-shielding member 5. The light-shielding member 5 may be made of a black-colored resin.

The light-shielding member 5 includes a sloping surface 5a. The sloping surface 5a of the black-colored resin 5 corresponds to the sloping surface 3a of the white-colored resin of the frame member 3. Accordingly, the sloping surface 5a of the black-colored resin 5 faces the light-emitting element 2 in the white-colored resin of the frame member 3.

In this variation, the frame member 3 has a cross-sectional shape that is triangle. Different from the second variation of the frame member 3, the frame member 3 includes a black-colored resin 5, and a white colored resin 3 that seals the black-colored resin 5.

Figure 4C:
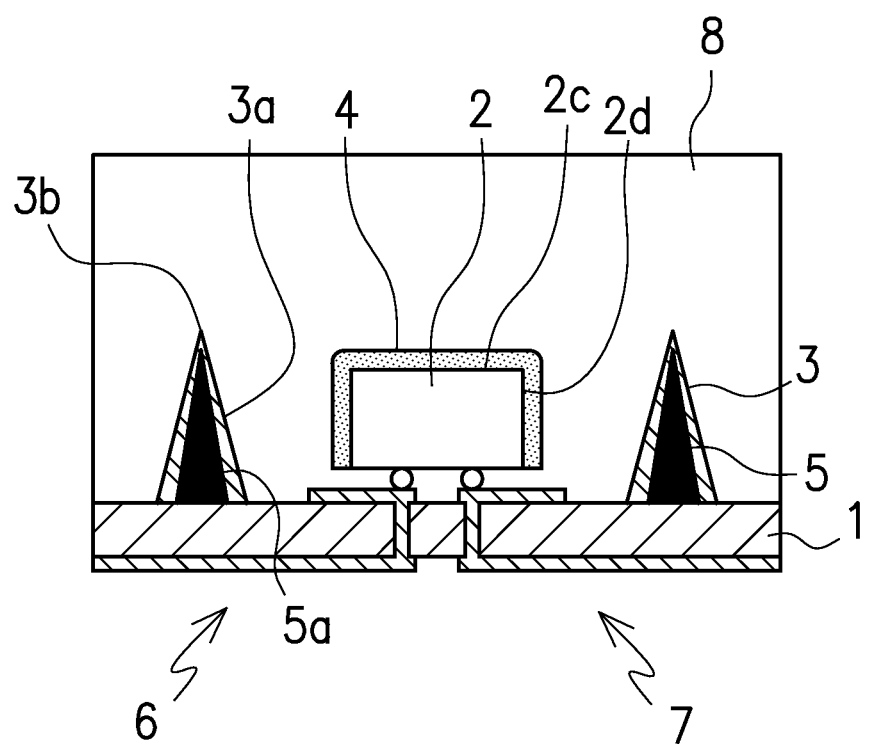
FIG. 4C is a cross sectional view of lighting device taken along a line IV-IV shown in FIG. 3, showing a light-transmitting resin that includes a first light-transmitting resin including a phosphor and a second light-transmitting resin that is transparent.

FIG. 4C is a cross sectional view of lighting device 200 taken along a line IV-IV shown in FIG. 3, showing a light-transmitting resin that includes a first light-transmitting resin including a phosphor and a second light-transmitting resin that is transparent.

In this embodiment, a lighting device includes a substrate 1, a light-emitting element 2 electrically mounted on the substrate 1, a frame member 3 surrounding the light-emitting element 2, and a light-transmitting resin 8 in which the light-emitting element 2 and the frame member 3 are embedded.

The light-emitting element 2 and the frame member 3 arranged on an upper surface 1a of the substrate 1 are entirely embedded within the light-transmitting resin.

Furthermore, the light-transmitting resin in this embodiment includes a first light-transmitting resin 4 and a second light-transmitting resin 8. The first light-transmitting resin 4 includes a phosphor and is arranged as a phosphor layer covering an upper surface 2c and a peripheral side surface 2d of the light-emitting element 2. The second light-transmitting resin 8 entirely seals the light-emitting element 2, the frame member 3, and the first light-transmitting resin 4 arranged as the phosphor layer covering the upper surface 2c and the peripheral side surface 2d of the light-emitting element 2. The frame member 3 may include a white resin and a light-shielding member sealed by the white resin.

Figure 5:
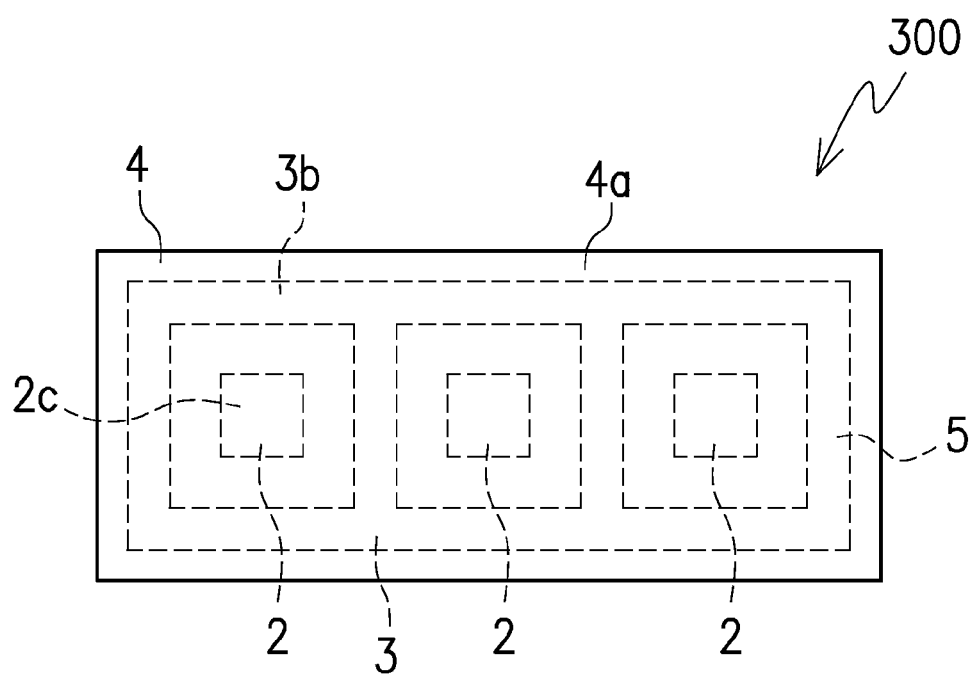
FIG. 5 is a schematic top plan view of lighting device according to a third embodiment of the present invention.

FIG. 5 is a schematic top plan view of lighting device 300 according to a third embodiment of the present invention.

In this embodiment, the lighting device 300 may have a parallelepiped shape as a whole. The frame member 3 arranged on a substrate 1 includes three openings each in which a single light-emitting element 2 is electrically arranged on the substrate 1. The frame member 3 is made of a white-colored resin, but as explained in FIGS. 2B and 4B, the frame member 3 may include a black-colored resin 5 inside the white-colored resin. The light-transmitting resin 4 including a phosphor entirely seals the light-emitting elements 2 and the frame member 3.

In this embodiment, the three openings of the frame member 3 are aligned in a line as shown in FIG. 5. Because an upper surface 3b that is flat of the frame member 3 is higher than an upper surface 2c of the light-emitting element 2, the frame member 3 efficiently prevents light emitted from the light-emitting element 2 in an opening from entering an adjacent opening in which another light-emitting element 2 is arranged and sealed by a light-transmitting resin 4 that includes a phosphor.

Accordingly, it is possible to prevent an unnecessary phosphor excitement in a lower region of a first opening by light from a light-emitting element 2 that is arranged in a second opening adjacent to the first opening of the frame member 3, and thus, light emitted from the upper surface 4a of the light-transmitting resin 4 appear to be an integrated light.

Figure 6A:
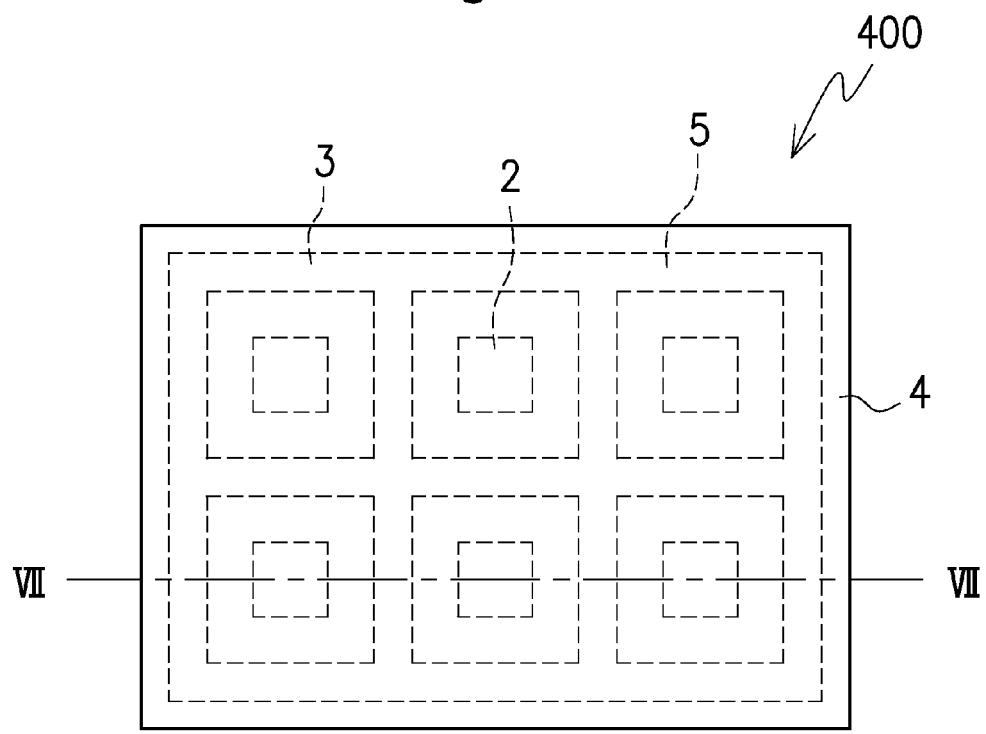
FIG. 6A is a schematic top plan view of lighting device according to a fourth embodiment of the present invention, showing with a dotted line a frame member that includes openings each in which a single light-emitting element is arranged.

FIG. 6A is a schematic top plan view of lighting device 400 according to a fourth embodiment of the present invention, showing with a dotted line a frame member 3 that includes openings each in which a single light-emitting element 2 is arranged.

In this variation, openings of the frame member 3 are arranged in a shape of grid. For more details, the frame member 3 includes six openings each in which a single light-emitting element 2 is arranged. The light-transmitting resin 4 integrally sealing the frame member 3 and six light-emitting elements 2 arranged in the openings of the frame member 3 has a parallelepiped shape as a whole.

Figure 6B:
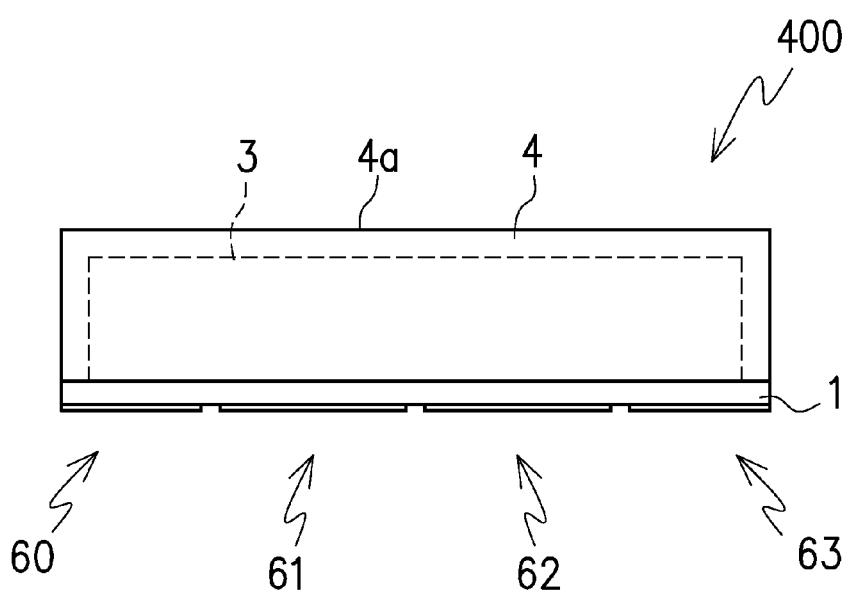
FIG. 6B is a schematic side view of lighting device shown in FIG. 6A, showing a frame member with a dotted line.

FIG. 6B is a schematic side view of lighting device 400 shown in FIG. 6A, showing a frame member 3 with a dotted line.

Figure 7A:
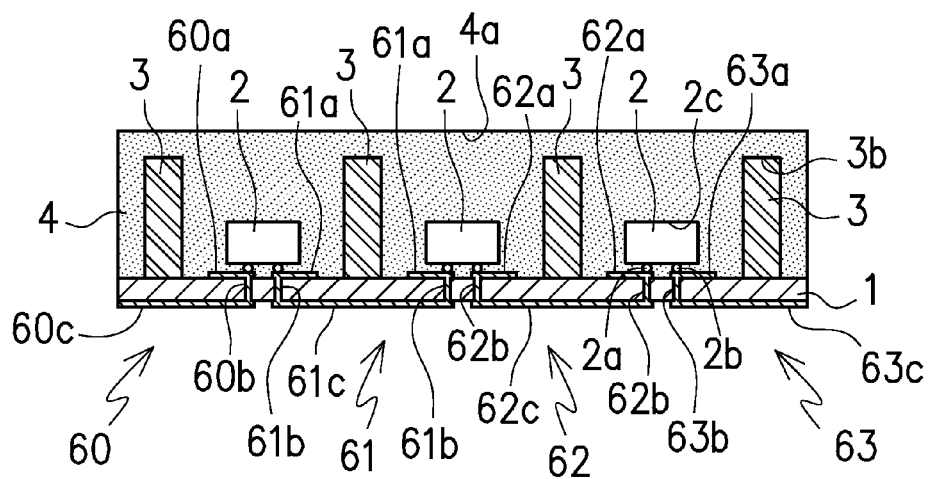
FIG. 7A is a cross-sectional view of lighting device taken along a line VII-VII shown in FIG. 6A, showing a fifth variation of frame member.

FIG. 7A is a cross-sectional view of lighting device 400 taken along a line VII-VII shown in FIG. 6A, showing a fifth variation of frame member 3. In this embodiment, two or more light-emitting elements 2 are electrically connected in series. For more details, FIG. 7A shows three light-emitting elements 2 each being arranged in an opening of the frame member 3. A first light-emitting element 2 is electrically mounted on a first electrode 60 and a second electrode 61. A second light-emitting element 2 is electrically mounted on the second electrode 61 and a third electrode 62. A third light-emitting element 2 is electrically mounted on the third electrode 62 and a fourth electrode 63. Each electrode of the first electrode 60, the second electrode 61, the third electrode 62, and the fourth electrode 63 include a first upper electrode 60a arranged on the upper surface 1a of the substrate 1, a first lower electrode 60c arranged on a lower surface 1b of the substrate 1, and a first through-hole 60b extending in the substrate 1 and electrically connected to the first upper electrode 60a and the first lower electrode 60c. Also, the second electrode 61 includes an upper electrode 61a arranged spaced away from the upper electrode 60a of the first electrode 60, a lower electrode 61c arranged spaced away from the lower electrode 60c of the first electrode 60, and a through-hole 61b spaced away from the first through-hole 60b and extending in the substrate 1 and electrically connected to the second upper electrode 61a and the second lower electrode 61c. Furthermore, the third electrode 62 includes an upper electrode 62a arranged spaced away from the upper electrode 61a of the second electrode 61, a lower electrode 62c arranged spaced away from the lower electrode 61c of the second electrode 61. In addition, the fourth electrode 63 includes an upper electrode 63a arranged spaced away from the upper electrode 62a of the third electrode 62, a lower electrode 63c arranged spaced away from the lower electrode 62c of the third electrode 62, and a through-hole 63b spaced away from the through-hole 63b of the fourth electrode 63.

Accordingly, these three light-emitting elements 2 are electrically connected in series as shown in FIG. 7A.

However, the number of light-emitting elements that are connected in series, in parallel or a combination of serial connection and parallel connection may be selectable according to a design, size, and/or a required brightness of a lighting device, for example. Also, the arrangements of electrodes and through-holes on the substrate may be selectable according to the number of light-emitting element to be mounted on a substrate, a design, size, and/or a required brightness of a lighting device, for example.

In this embodiment, because an upper surface 3b of the frame member 3 is higher than an upper surface 2c of the light-emitting element 2, the frame member 3 efficiently prevents light emitted from the light-emitting element 2 from entering an adjacent opening in which another light-emitting element 2 is arranged and sealed by a light-transmitting resin 4 that includes a phosphor.

Accordingly, it is possible to prevent an unnecessary phosphor excitement in a lower region of an opening by light from a light-emitting element that is arranged in another opening of the frame member 3. Furthermore, since an upper surface 4a of the light-transmitting resin 4 is higher than the upper surface 3a of the frame member 3, light emitted from the upper surface 4a of the light-transmitting resin 4 appear as an integrated light.

Figure 7B:
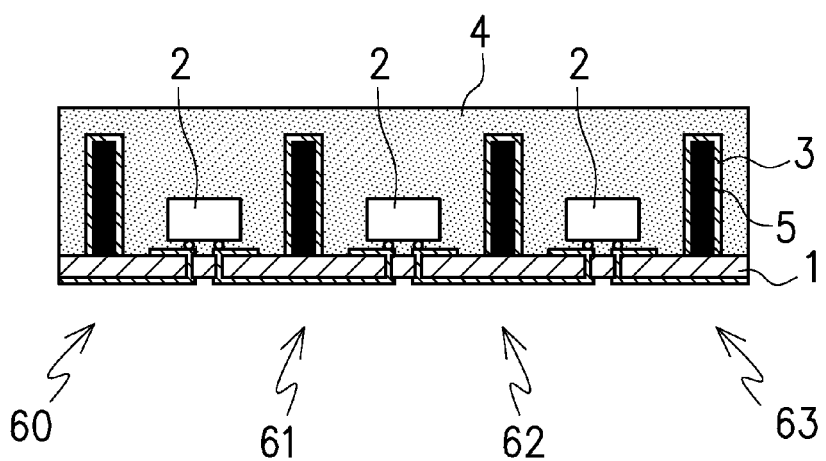
FIG. 7B is a cross-sectional view of lighting device taken along a line VII-VII shown in FIG. 6A, showing a sixth variation of frame member.

FIG. 7B is a cross-sectional view of lighting device taken along a line VII-VII shown in FIG. 6A, showing a sixth variation of frame member 3. If the frame member 3 includes a light-shielding member 5 inside the white-colored resin, light that hits the frame member 3 will be efficiently reflected by the white-colored resin portion and sufficiently shielded by the light-shielding member 5 to prevent lateral light of the light-emitting element 2 arranged in a first opening from passing through the frame member 3 into a second opening adjacent to the first opening of the frame member 3.

For more details, the light-shielding member 5 of the frame member 3 may be a black-colored resin 5 that contains a graphite powder and/or a metal powder, which is better than a reflective particle in light absorption, is arranged inside the white-colored resin of the frame member 3.

Figure 8:
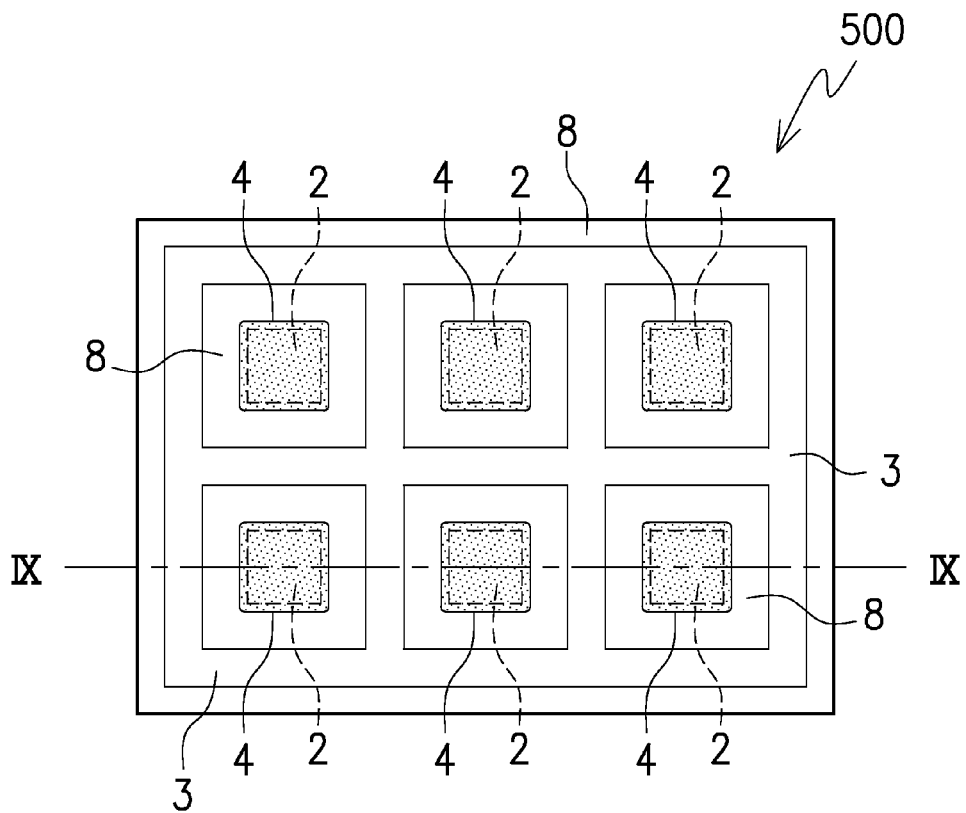
FIG. 8 shows a top plan view of lighting device according to a fifth embodiment of the present invention, showing a frame member with a line entirely sealed by a light-transmitting resin that is transparent.
Figure 9:
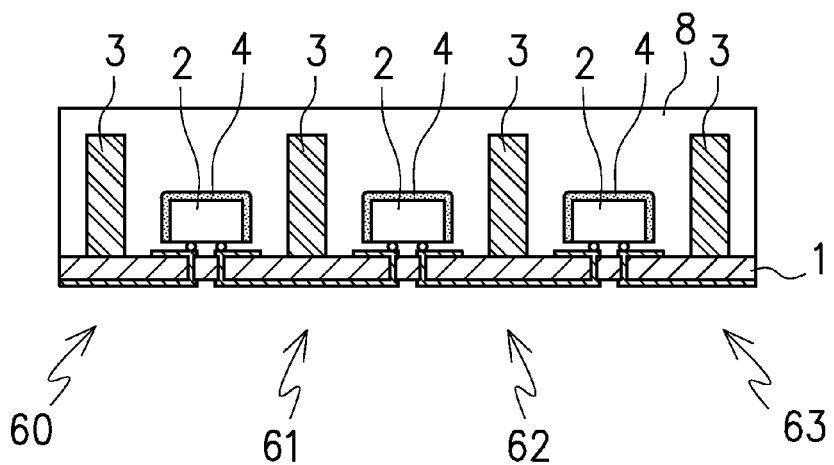
FIG. 9 shows a cross-sectional view of lighting device taken along a line IX-IX shown in FIG. 8.

FIG. 8 shows a top plan view of lighting device 500 according to a fifth embodiment of the present invention. Also, FIG. 9 shows a cross-sectional view of lighting device taken along a line IX-IX shown in FIG. 8.

In this variation, the frame member 3 includes six openings each in which a single light-emitting element 2 is arranged. A light-transmitting resin 4 as a first light-transmitting resin that includes a phosphor is directly layered on the light-emitting elements 2 and another light-transmitting resin 8 as a second light-transmitting resin that is a transparent resin entirely seals the light-transmitting resin 4 including the phosphor layered on the light-emitting elements 2 and the light-emitting elements 2 and the frame member 3. The second light-transmitting resin 8 integrally sealing the frame member 3 and six light-emitting elements 2 arranged in the openings of the frame member 3 has a parallelepiped shape as a whole. In this embodiment, the frame member 3 may have a cross-sectional shape that is rectangular as shown in FIG. 9.

Figure 10A:
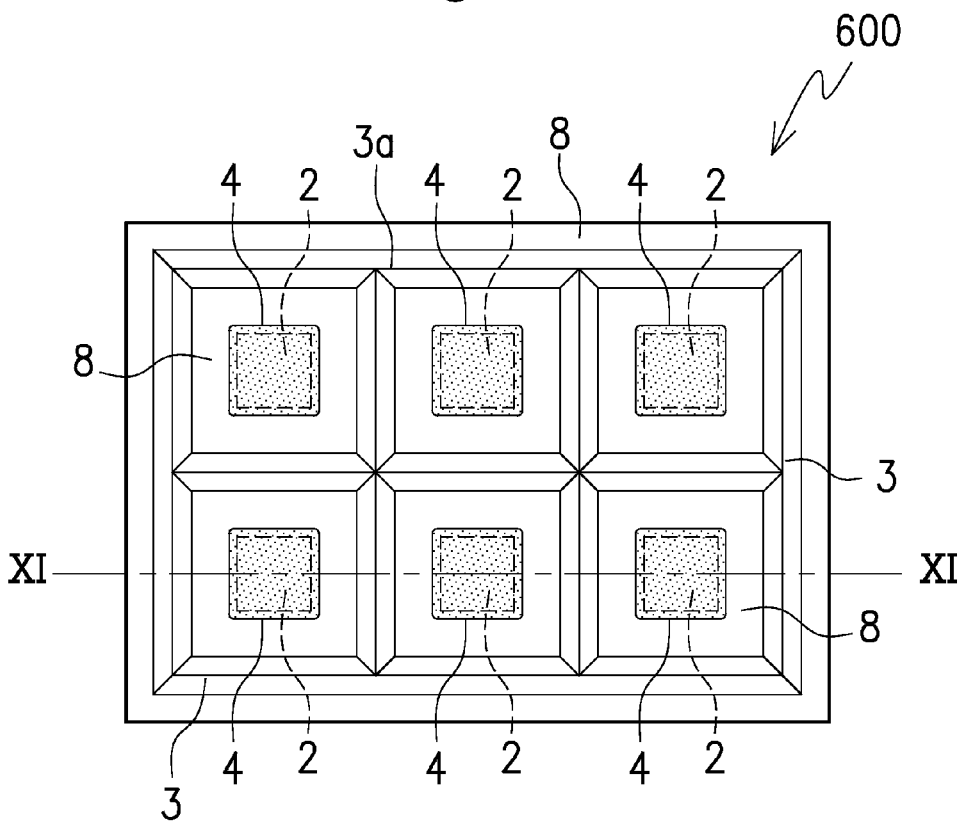
FIG. 10A shows a top plan view of lighting device according to a sixth embodiment of the present invention, showing a frame member with a line entirely sealed by a light-transmitting resin that is transparent. The frame member of this embodiment includes a sloping surface that faces a peripheral side surface of the light-emitting element.

FIG. 10A shows a top plan view of lighting device 600 according to a sixth embodiment of the present invention. In this variation, the frame member 3 includes two or more openings each in which a single light-emitting element 2 is arranged. The frame member 3 may have a cross-sectional shape that is triangle.

Figure 10B:
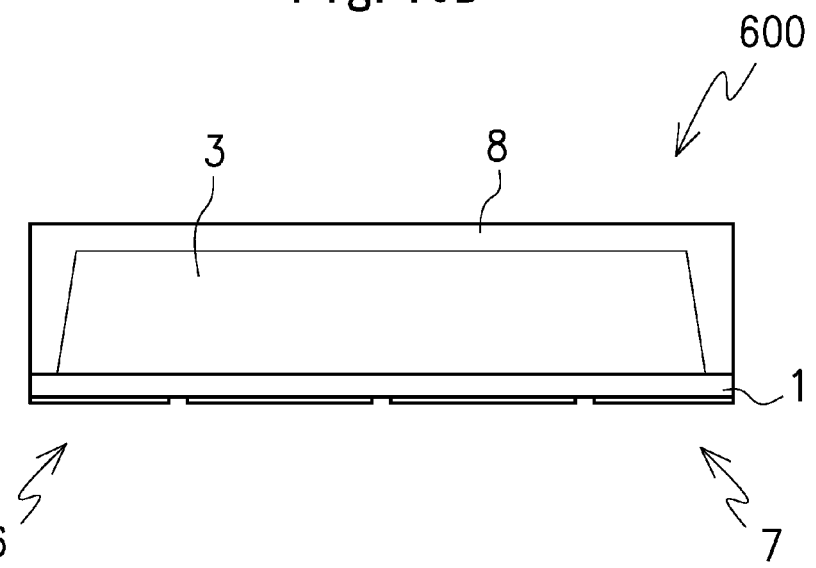
FIG. 10B is a schematic side view of lighting device shown in FIG. 10A, showing a frame member entirely sealed by a light-transmitting resin that is transparent.

FIG. 10B is a schematic side view of lighting device 600 shown in FIG. 10A, showing a frame member 3 with a line entirely sealed by a light-transmitting resin 8 that is transparent.

Different from the fifth embodiment of the lighting device 500 shown in FIG. 8, the frame member 3 of the lighting device 600 includes a sloping surface 3a that faces the light-emitting element 2. The sloping surface 3a of the frame member is inclined upward. The frame member 3 may have a cross-sectional shape that is triangle, right-angled triangle, or isosceles triangle as shown in FIGS. 11A and 11B, for example.

Figure 11A:
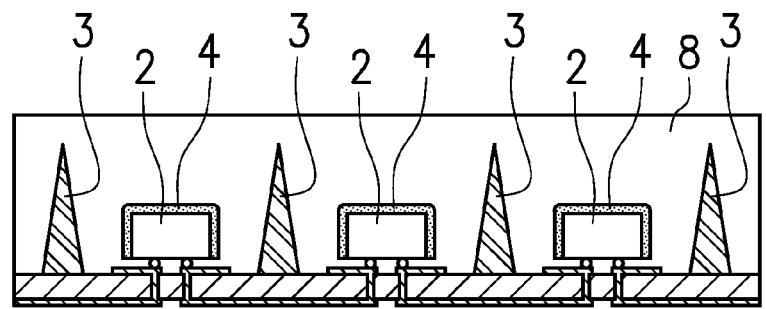
FIG. 11A is a cross-sectional view of lighting device taken along a line XI-XI shown in FIG. 10A, showing a seventh variation of frame member.

FIG. 11A is a cross-sectional view of lighting device 600 taken along a line XI-XI shown in FIG. 10A, showing a seventh variation of frame member 3. In this variation of frame member 3, the frame member 3 includes a plurality of openings defined by sloping surfaces 3a. In each of the openings, a light-emitting element 2 is electrically arranged on an upper surface 1a of a substrate 1. The openings of the frame member 3 are arranged in a shape of grid. In this embodiment, three light-emitting elements 2 that are arranged side by side are electrically connected in series, however, the number of light-emitting elements that are connected in series, in parallel or a combination of serial connection and parallel connection may be selected according to a design, size, and/or a required brightness of a lighting device.

Figure 11B:
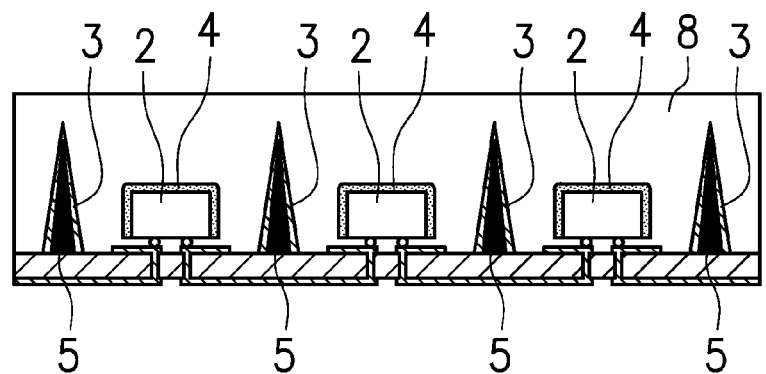
FIG. 11B is a cross-sectional view of lighting device taken along a line XI-XI shown in FIG. 10A, showing an eighth variation of frame member.

FIG. 11B is a cross-sectional view of lighting device 600 taken along a line XI-XI shown in FIG. 10A, showing a eighth variation of frame member 3. The frame member 3 includes a light-shielding member 5 inside the white-colored resin, light that hits the frame member 3 will be efficiently reflected by the white-colored resin portion and sufficiently shielded by the light-shielding member 5 to prevent lateral light of the light-emitting element 2 from passing through the frame member 3 into another opening of the frame member 3. In this configuration, unnecessary excitement of light by phosphor in a lower portion of another opening is expected to be avoided.

Figure 12A:
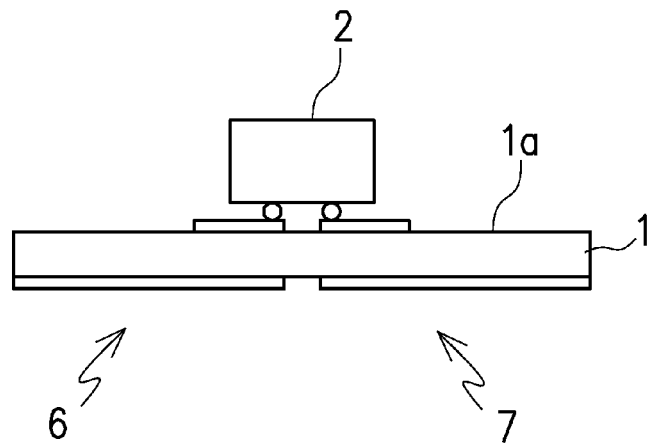
FIGS. 12A to 12D show a first embodiment of method to manufacture a lighting device according to the present invention.
Figure 12B:
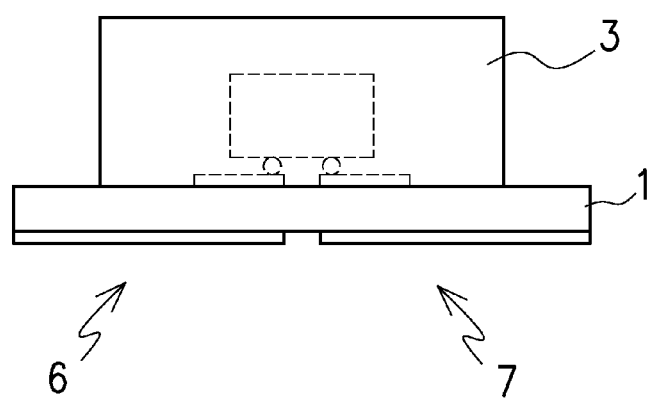
Figure 12C:
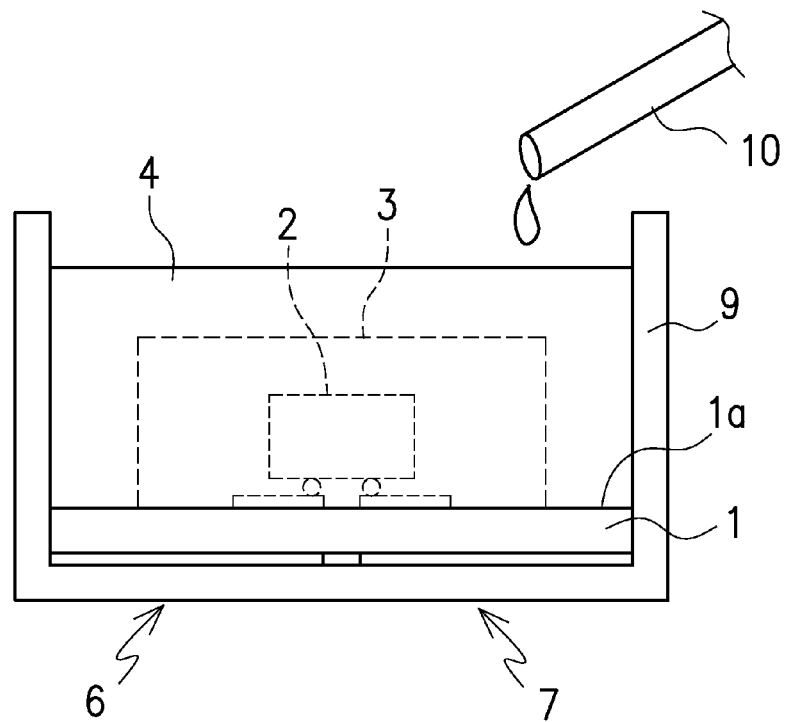
Figure 12D:
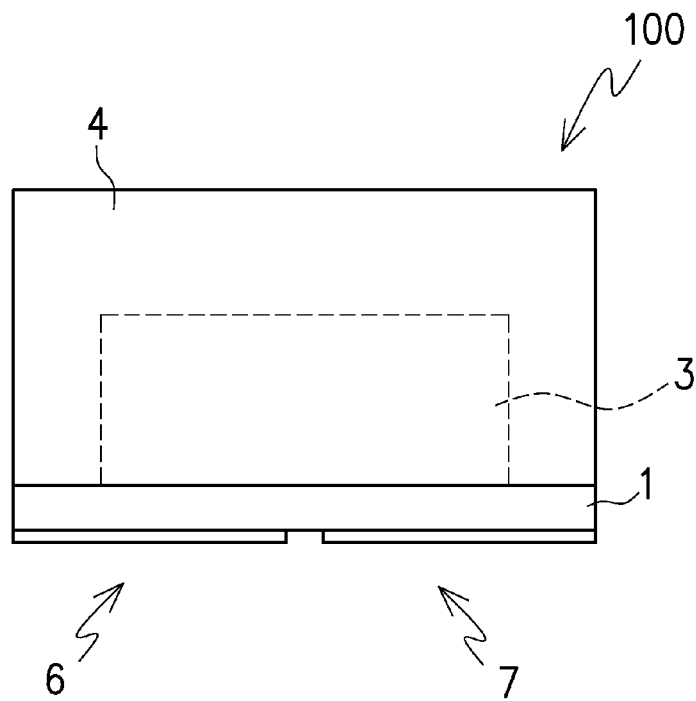

FIGS. 12A to 12D show a first embodiment of method to manufacture a lighting device according to the present invention. A method manufacturing a lighting device in this embodiment includes electrically mounting a light-emitting element 2 on an upper surface 1a of a substrate 1, arranging a frame member 3, which includes a light-shielding member 5 embedded in a white-colored resin, on the upper surface 1a of the substrate such that the light-emitting element 2 is positioned in an opening of the frame member 3, and entirely sealing the light-emitting element 2 and the frame member 3 on the upper surface 1a of the substrate 1 with a light-transmitting resin 4. As shown in FIG. 12C, the light-emitting elements 2, and the frame member 3 on the upper surface 1a of the substrate 1 are entirely sealed with a light-transmitting resin 4 that includes a phosphor and that is dipped by a dispenser 10 in a tray 9. The light-transmitting resin 4 in this embodiment may include one or more phosphor.

Furthermore, it is possible to obtain a lighting device including two or more light-emitting elements 2. A method in this embodiment includes electrically mounting two or more light-emitting elements 2 on an upper surface 1a of a substrate 1, arranging a frame member 3 with two or more openings on the upper surface 1a of the substrate such that at least one light-emitting element 2 is positioned in one of the openings of the frame member 3, entirely sealing the light-emitting elements 2 and the frame member 3 on the upper surface 1a of the substrate 1 with a light-transmitting resin 4. The frame member 3 may include a white-colored resin and a light-shielding member 5 that is entirely sealed by the white-colored resin.

FIGS. 13A to 13G show a second embodiment of method to manufacture a lighting device according to the present invention.

Figure 13A:
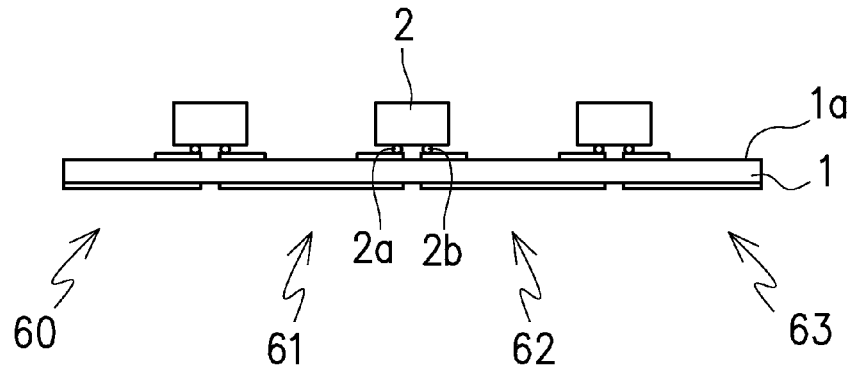
FIGS. 13A to 13G show a second embodiment of method to manufacture a lighting device according to the present invention.

As shown in FIG. 13A, the method includes electrically mounting two or more light-emitting elements 2 on an upper surface 1a of a substrate 1.

Figure 13B:
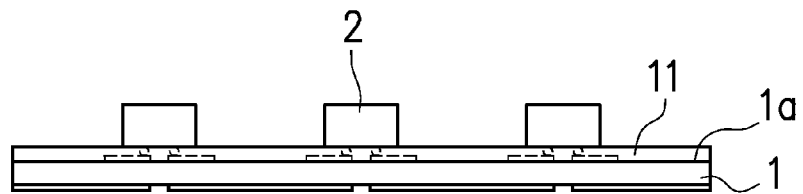

Also, as shown in FIG. 13B, the method includes arranging a masking layer 11 on the upper surface 1a of the substrate 1.

Figure 13C:
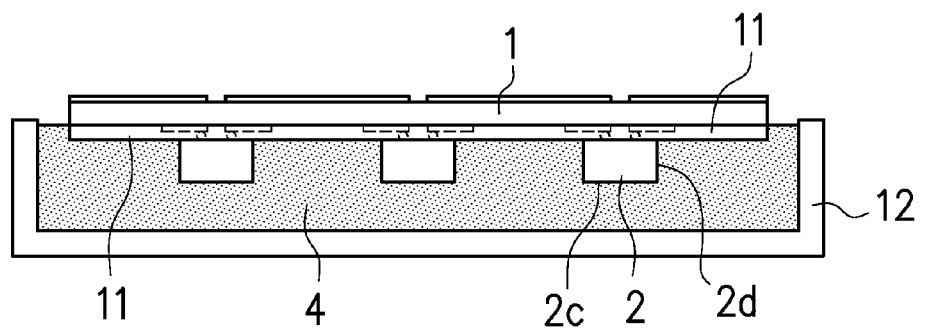
Figure 13D:
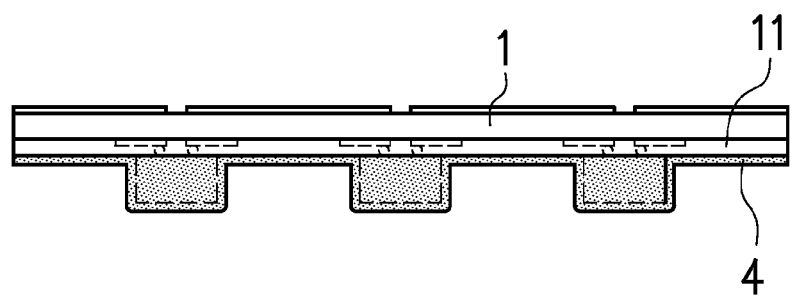

Also, as shown in FIGS. 13C and 13D, the method further includes dipping the light-emitting elements 2 into a first light-transmitting resin 4 including a phosphor, which is in a condition of liquid in a dipping tray 12, to make a phosphor layer on upper and peripheral side surfaces 2c, 2d of the light-emitting elements 2.

Figure 13E:
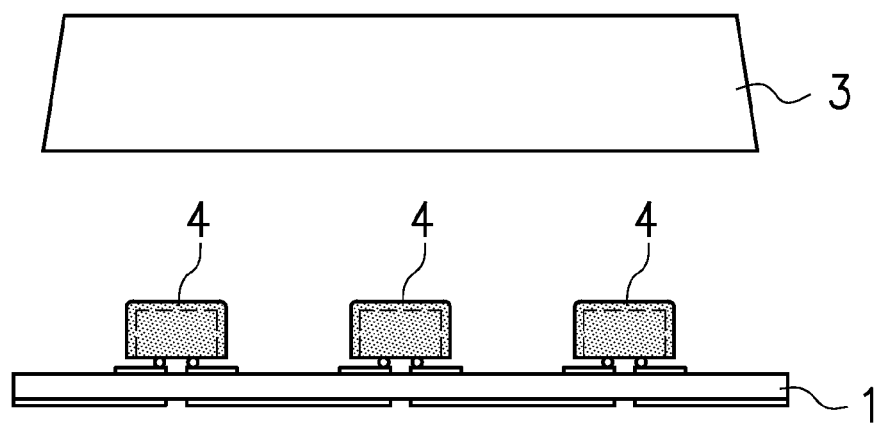

Furthermore, as shown in FIG. 13E, the method includes ripping the masking layer 11 from the upper surface 1a of the substrate 1, and arranging a frame member 1 with two or more openings on the upper surface 1a of the substrate such that at least one light-emitting element 2 is positioned in one of the openings of the frame member 3.

Figure 13F:
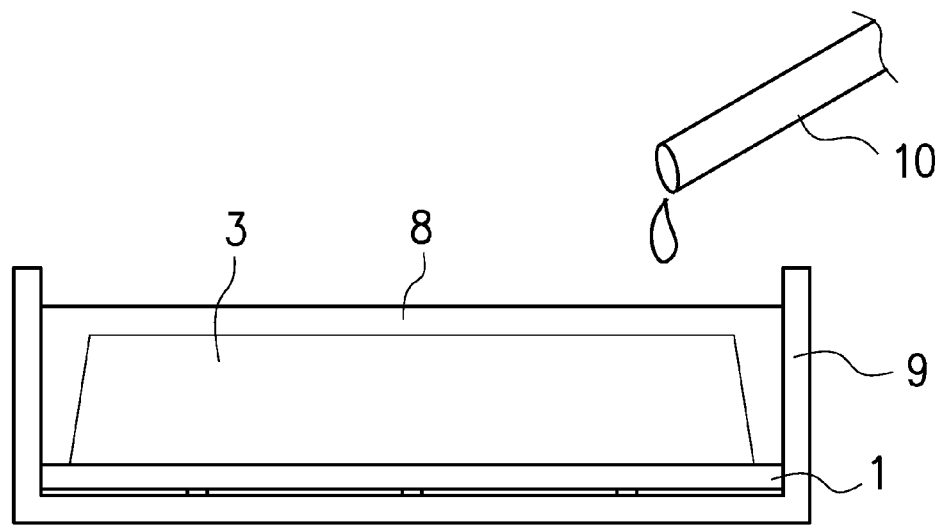
Figure 13G:
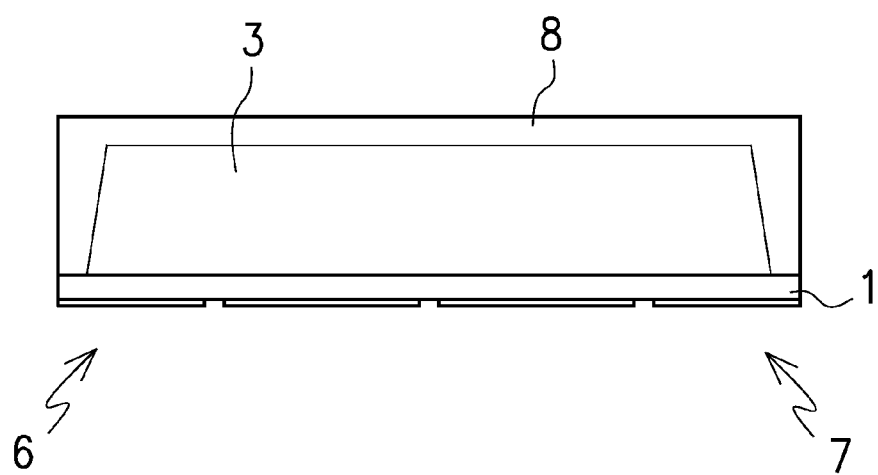

Also, as shown in FIG. 13F, the method includes entirely sealing the light-emitting elements 2, and the frame member 3 on the upper surface of the substrate 1 with a second light-transmitting resin 8 dipped by a dispenser 10 in a tray 9. The second light-transmitting resin 8 in this embodiment may be transparent resin. FIG. 13G shows a lighting device according to an embodiment of the present invention, obtainable by this method.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
   a substrate;
   a light-emitting element electrically mounted on the substrate;
   a frame member comprising a white-colored resin and surrounding the light-emitting element; and
   a light-transmitting resin in which the light-emitting element and the frame member are embedded, wherein
   the frame member further comprises a light-shielding member, and
   the white-colored resin of the frame member comprising a reflective particle entirely seals the light-shielding member.

2. The lighting device according to claim 1,
   the light-transmitting resin comprises a phosphor.

3. The lighting device according to claim 1,
   the light-transmitting resin comprises transparent resin.

4. The lighting device according to claim 1,
   the frame member comprises a sloping surface that faces a peripheral side surface of the light-emitting element.

5. The lighting device according to claim 1,
   the frame member has a square ring shape in a top plan view.

6. The lighting device according to claim 1,
the light-shielding member of the frame member comprises a black-colored resin, and
the white colored resin of the frame member entirely seals the black-colored resin.

7. The lighting device according to claim 1,
the light-shielding member of the frame member comprises a metal powder.

8. The lighting device according to claim 1,
the light-shielding member of the frame member comprises a graphite powder.

9. The lighting device according to claim 1,
the reflective particle included in the white-colored resin of the frame member is titanium oxide particle.

10. The lighting device according to claim 1,
the light-shielding member of the frame member comprises a metal frame embedded in the white-colored resin of the frame member.

11. The lighting device according to claim 1,
the light-shielding member of the frame member comprises a sloping surface inside the white-colored resin of the frame member.

12. The lighting device according to claim 1,
the light-transmitting resin further comprises a first light-transmitting resin and a second light-transmitting resin,
the first light-transmitting resin includes a phosphor and is arranged as a phosphor layer covering an upper surface and a peripheral side surface of the light-emitting element, and
the second light-transmitting resin entirely seals the light-emitting element on the substrate, the frame member on the substrate, and the first light-transmitting resin arranged as the layer covering the upper surface and the peripheral side surface of the light-emitting element.

13. The lighting device according to claim 1,
the frame member comprises a silicone resin as a primary material, and the light-transmitting resin comprises a silicone resin as a primary material.

14. A lighting device comprising:
a substrate;
two or more light-emitting elements electrically mounted on the substrate;
a frame member comprising a white-colored resin and two or more openings each in which at least one light-emitting element of the two or more light-emitting elements is arranged; and
a light-transmitting resin in which the light-emitting element and the frame member are embedded, wherein
the frame member further comprises a light-shielding member that is embedded in the white-colored resin of the frame member.

15. The lighting device according to claim 14,
the two or more openings of the frame member are aligned in a line.

16. The lighting device according to claim 14,
the two or more openings of the frame member are arranged in a shape of grid.

17. The lighting device according to claim 14,
the frame member further comprises a sloping surface.

18. A method of manufacturing a lighting device comprising:
electrically mounting a light-emitting element on an upper surface of a substrate;
arranging a frame member, which comprises a light-shielding member embedded in a white-colored resin, on the upper surface of the substrate such that the light-emitting element is positioned in an opening of the frame member; and
entirely sealing the light-emitting element and the frame member on the upper surface of the substrate with a light-transmitting resin.

19. The lighting device according to claim 14, wherein the light-shielding member is inside the white-colored resin of the frame member.

20. The lighting device according to claim 14, wherein the light-shielding member comprises a black-colored resin.

* * * * *